United States Patent
Haq et al.

(10) Patent No.: US 9,972,777 B1
(45) Date of Patent: May 15, 2018

(54) MTJ DEVICE PROCESS/INTEGRATION METHOD WITH PRE-PATTERNED SEED LAYER

(71) Applicant: Headway Technologies, Inc., Milpitas, CA (US)

(72) Inventors: Jesmin Haq, Milpitas, CA (US); Tom Zhong, Saratoga, CA (US); Zhongjian Teng, Santa Clara, CA (US); Dongna Shen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days. days.

(21) Appl. No.: 15/479,497

(22) Filed: Apr. 5, 2017

(51) Int. Cl.
*H01L 43/08* (2006.01)
*H01L 43/12* (2006.01)

(52) U.S. Cl.
CPC .............. *H01L 43/12* (2013.01); *H01L 43/08* (2013.01)

(58) Field of Classification Search
CPC ......... H01L 43/08; H01L 43/12; H01L 43/00; H01L 21/67; H01L 21/67709

USPC ............................................. 438/3
See application file for complete search history.

(56) References Cited

U.S. PATENT DOCUMENTS

| 6,849,465 B2 | 2/2005 | Park et al. |
| 6,921,953 B2 * | 7/2005 | Deak ................ G11C 11/16 257/108 |
| 9,373,782 B2 | 6/2016 | Li et al. |

* cited by examiner

*Primary Examiner* — Chuong A Luu
(74) *Attorney, Agent, or Firm* — Saile Ackerman LLC; Stephen B. Ackerman; Rosemary L. S. Pike

(57) ABSTRACT

A method for etching a magnetic tunneling junction (MTJ) structure is described. A bottom electrode layer is provided on a substrate. A seed layer is deposited on the bottom electrode layer. The seed layer and bottom electrode layer are patterned. A dielectric layer is deposited over the patterned seed layer and bottom electrode layer and planarized wherein the seed layer is exposed. Thereafter, a stack of MTJ layers is deposited on the patterned seed layer comprising a pinned layer, a tunnel barrier layer, and a free layer. The MTJ stack is then patterned to form a MTJ device. Because the seed layer was patterned before the MTJ patterning step, the exposure of the device to etching plasma gases is shortened and thus, etch damage is minimized.

18 Claims, 6 Drawing Sheets

US 9,972,777 B1

MTJ DEVICE PROCESS/INTEGRATION METHOD WITH PRE-PATTERNED SEED LAYER

TECHNICAL FIELD

This application relates to the general field of magnetic tunneling junctions (MTJ) and, more particularly, to etching methods for forming MTJ structures.

BACKGROUND

Fabrication of magneto-resistive devices normally involves a sequence of processing steps during which many layers of metals and dielectrics are deposited and then patterned to form a magneto-resistive stack as well as electrodes for electrical connections. The magneto-resistive stack usually includes the free and pinned layers of the device, sandwiched around one or more dielectric layers functioning as the tunnel junction for the magnetic tunnel junction (MTJ) device.

A critical challenge in magnetic randam access memory (MRAM) technology is the patterning of the magnetic tunnel junction (MTJ) stack without damaging the device. The thin magnetic layers used in the MTJ stack, are easily damaged during plasma etch processes. Therefore a processing scheme for manufacturing the MTJ device that can minimize the exposure of the tunnel junction to plasma processes is desired.

U.S. Pat. No. 6,849,465 (Park et al) and U.S. Pat. No. 9,373,782 (Li et al) teach patterning the bottom electrode first, then depositing and patterning the MTJ stack, but these methods are different from the present disclosure.

SUMMARY

It is an object of the present disclosure to provide an improved method of forming MTJ structures.

Yet another object of the present disclosure is to provide a method of MTJ device patterning that can minimize etch damage of the device caused by long exposure to etching plasma gases.

In accordance with the objectives of the present disclosure, a method for etching a magnetic tunneling junction (MTJ) structure is achieved. A bottom electrode layer is provided on a substrate. A seed layer is deposited on the bottom electrode layer. The seed layer and bottom electrode layer are patterned. A dielectric layer is deposited over the patterned seed layer and bottom electrode layer and planarized. Thereafter, a stack of MTJ layers is deposited on the patterned seed layer comprising a pinned layer, a tunnel barrier layer, and a free layer. The MTJ stack is then patterned to form a MTJ device. Because the seed layer was patterned before the MTJ patterning step, the exposure of the device to etching plasma gases is shortened and thus, etch damage is minimized.

BRIEF DESCRIPTION OF THE DRAWINGS

In the accompanying drawings forming a material part of this description, there is shown:

FIGS. 5 through 8A and 8B illustrate in cross-sectional representation steps in a first preferred embodiment of the present disclosure.

FIGS. 8A and 8B illustrate in cross-sectional representation two options for a seed layer width in a preferred embodiment of the present disclosure.

DETAILED DESCRIPTION

Figure 1:
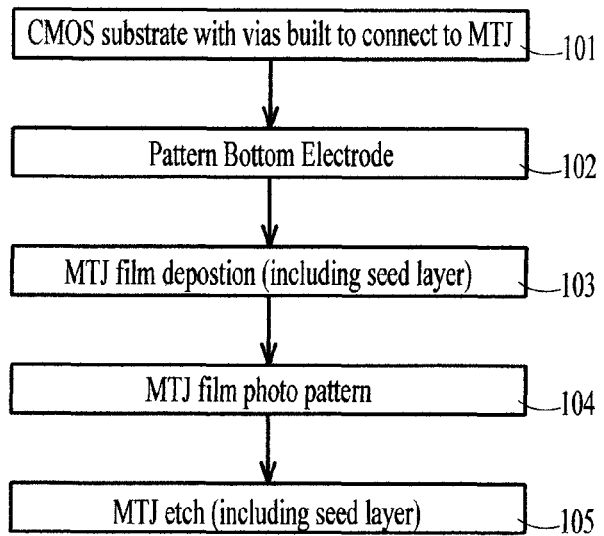
FIG. 1 is a flowchart of a MTJ process sequence of the prior art.

A novel integration scheme for avoiding damage to MTJ layers due to long exposure to plasma processes is described. FIG. 1 is a flowchart showing a standard method of forming a magnetic tunnel junction (MTJ) device, as shown in cross-section in FIGS. 2 and 3.

Figure 2:
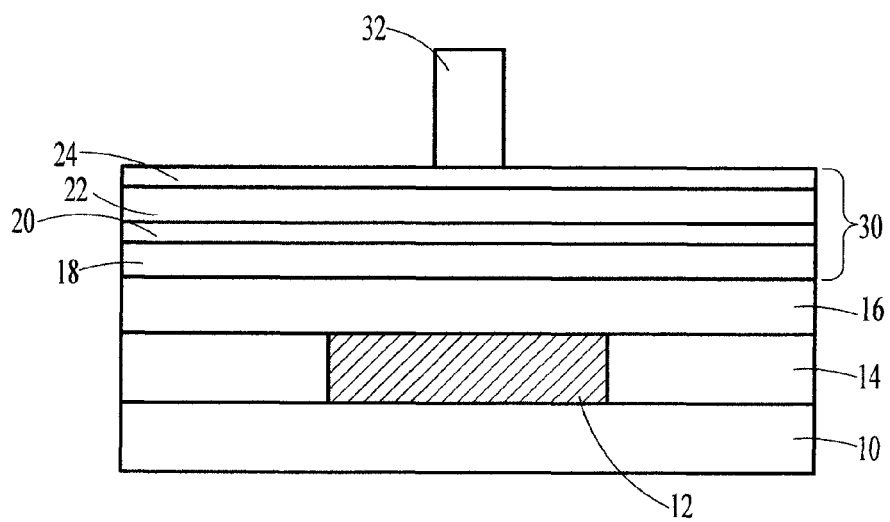
FIGS. 2 and 3 are cross-sectional representations of steps in a process of the prior art.

As shown in FIG. 1, in a first step 101, a CMOS substrate with vias is built to connect with the MTJ device to be formed subsequently. The substrate 10 is shown in FIG. 2. Next in step 102, a bottom electrode is patterned. FIG. 2 illustrates bottom electrode 12 and subsequently deposited and planarized dielectric layer 14. Next in step 103, the MTJ film layers are deposited, including a seed layer 16, pinned layer 18, barrier layer 20, free layer 22, and cap layer 24, as shown in FIG. 2. These layers form the MTJ film stack 30.

Figure 3:
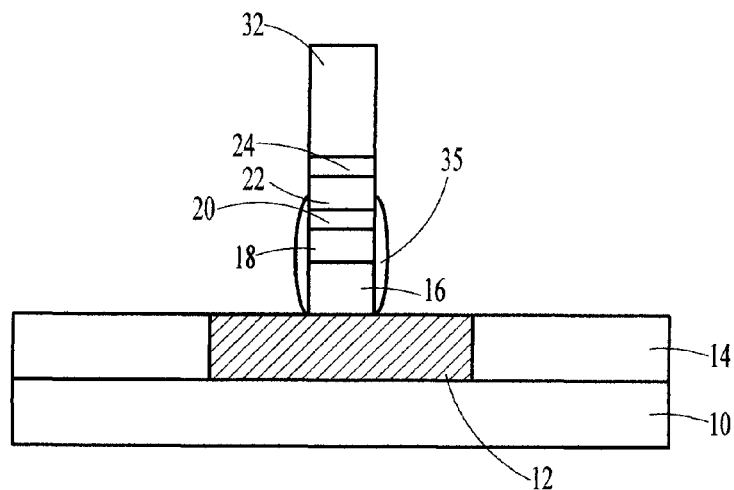

In step 104, a photoresist pattern is made to pattern the MTJ device. FIG. 2 illustrates patterned hard mask 32. In step 105, the MTJ stack is etched. FIG. 3 illustrates the etching of the MTJ stack which includes the seed layer 16. The magnetic film stack is etched using the hard mask. The MTJ layers are very thin and can be damaged easily during plasma etch. In the standard MRAM etching process, the etching plasmas may physically or chemically damage the layers or may cause re-deposition of metal-containing residues. This may be due to the low etch selectivity and non-volatile nature of by-products that are formed during the etch process. Such residues may build up along the sidewall of the patterned film stack and form a conductive path as shown by 35 in FIG. 3. This conductive path or damaged layers may cause electrical short-circuits within a MRAM device, e.g., between the magnetic layers separated by the tunnel layer, or may degrade the MRAM device performance or the MRAM device may not be functional at all.

The basic idea of the present disclosure is to create a novel process integration scheme to minimize the physical or chemical damage of the magnetic layers and reduce re-deposition of metal-containing residues. The bottom layer of a magnetic memory device is the seed layer. The purpose of the seed layer is to promote the growth of large crystal grains and also sometimes to provide the correct crystallographic orientation. The seed layer needs to be thick enough to serve these purposes. It could be about ⅓ the thickness of the entire MTJ stack. Because of this thickness, sometimes it takes a long time to etch the seed layer and a long over etch time to confirm there is no residue left on the surface. This long exposure to etching plasma gases can cause physical or chemical damage to other critical layers, e.g. pinned layer, barrier layer and free layer, and can also cause re-deposition of metal-containing residues 35 along the sidewall as shown in FIG. 3. If the etching time can be reduced, the physical or chemical damage and the re-deposition along the sidewall also can be reduced.

A key feature of the present disclosure is the combination of the seed layer etching process with the bottom electrode etching. The seed layer will be deposited along with the bottom electrode deposition.

Figure 4:
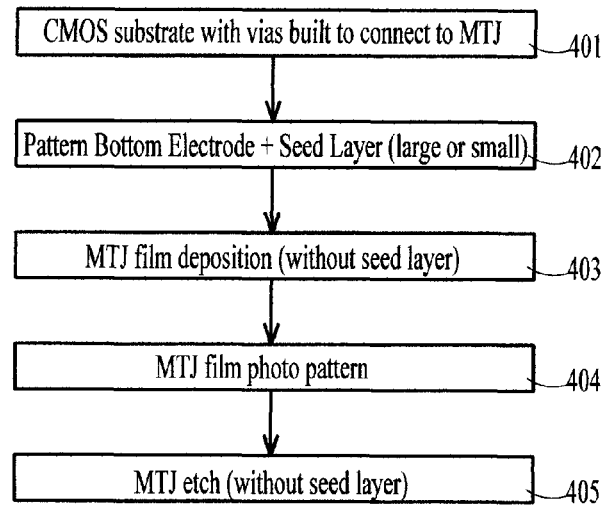
FIG. 4 is a flowchart of a first preferred embodiment of the present disclosure.
Figure 5:
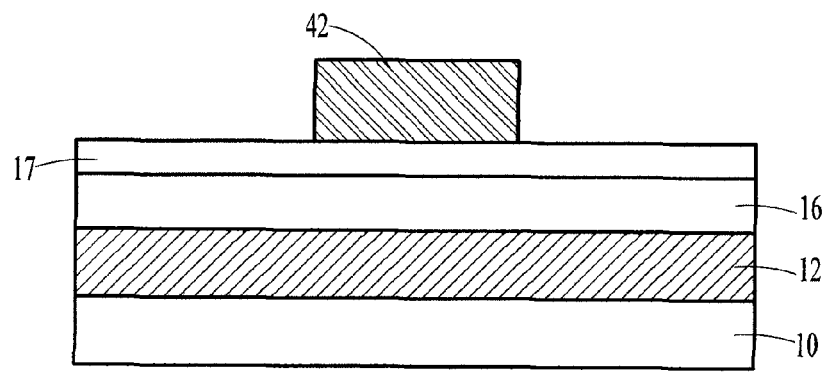

FIG. 4 is a flowchart of a first preferred embodiment process of the present disclosure. Refer also to FIGS. 5-8*a* and 8*b*. In step 401, a CMOS substrate with vias is built to connect with the MTJ device to be formed subsequently. The substrate 10 is shown in FIG. 5. Next in step 402, a bottom electrode and seed layer are patterned. FIG. 5 illustrates bottom electrode layer 12, seed layer 16, and a protective layer 17 such as Ta or TiN to be used as a hard mask for etching the seed layer. The bottom electrode and the seed layer can be patterned together using the seed layer as a hard mask for etching the bottom electrode or separately using two photolithographic steps and subsequently planarized. Photoresist pattern 42 is shown in FIG. 5.

Figure 6:
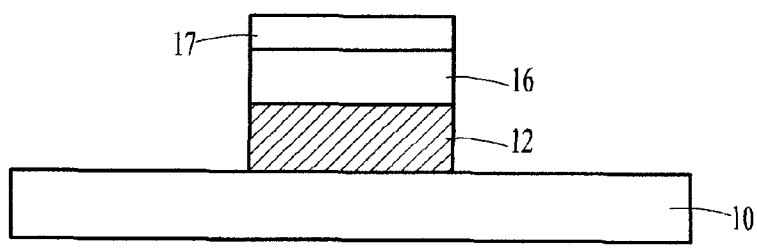
Figure 7:
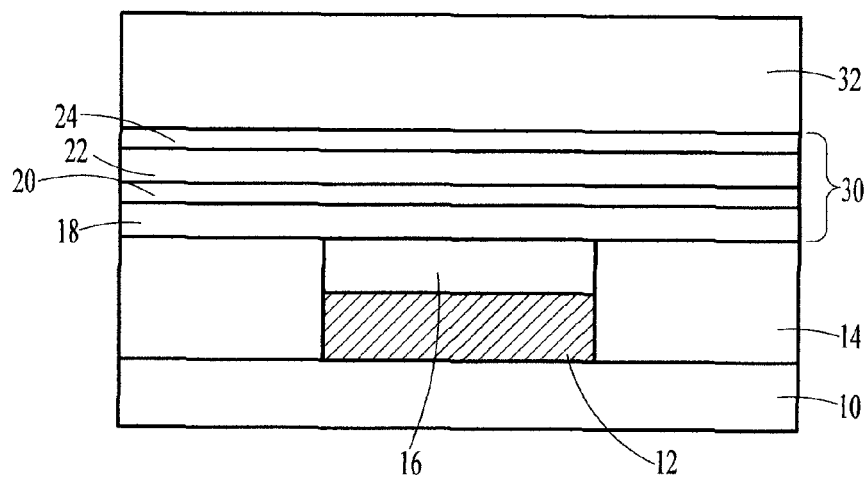

FIG. 6 shows the patterned bottom electrode 12 and seed layer 16. Dielectric layer 14 is deposited and planarized, as shown in FIG. 7. Protective layer 17 is removed by chemical mechanical polishing (CMP) or another planarization process either before or after the dielectric layer 14 is formed. The protective layer 17 also can be removed during the sputter etch before MTJ film deposition. Prior to MTJ film deposition, the seed layer is exposed, such as during the planarization step.

Now in step 403, the MTJ film layers are deposited, including pinned layer 18, barrier layer 20, free layer 22, and cap layer 24, as shown in FIG. 7. The first layer of the stack will directly contact the seed layer 16. These layers form the MTJ film stack 30. Hard mask layer 32 is deposited on top of the MTJ layer stack.

Figure 8A:
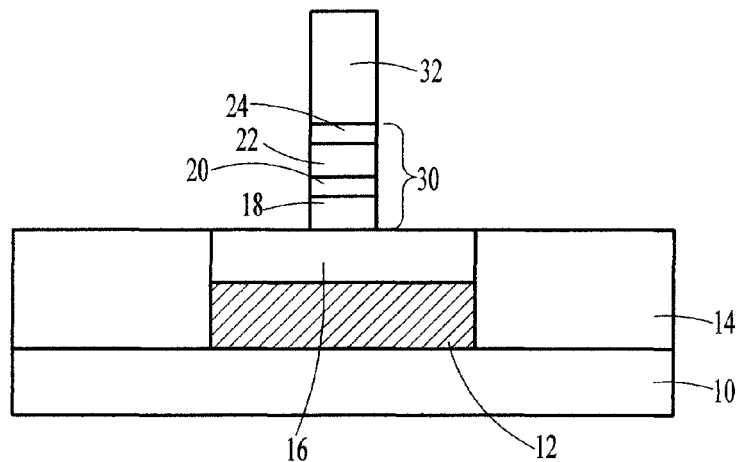
Figure 8B:
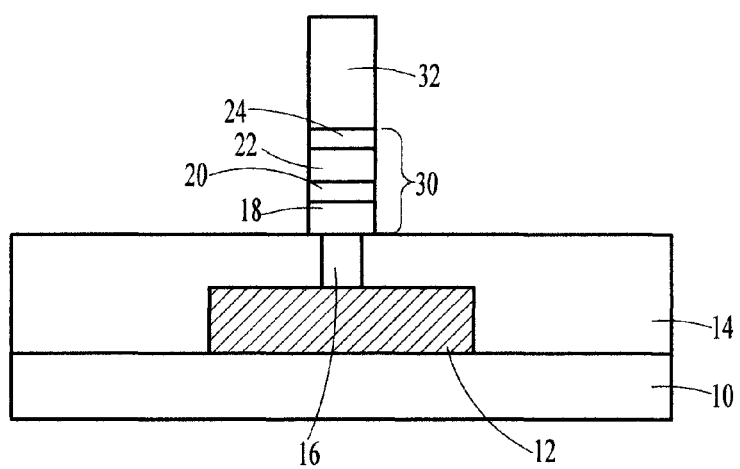

In step 404, a photoresist pattern is made to pattern the MTJ device and the pattern is transferred to the hard mask 32. In step 405, the MTJ stack is etched. FIG. 8 illustrates the etching of the MTJ stack. Since the seed layer 16 has already been patterned, the tunnel junction etching time is significantly reduced. Hence, there will be less etch damage and less re-deposition on the sidewall. The pre-patterned seed layer can be larger, equal to, or slightly smaller than the MTJ device. FIG. 8*a* shows a seed layer larger than the MTJ device and FIG. 8*b* shows a seed layer smaller than the MTJ device. In the case of the equal or smaller seed layer, the metal re-deposition on the sidewall will be reduced even more since during over etching only dielectric material 14 will be exposed.

Figure 9:
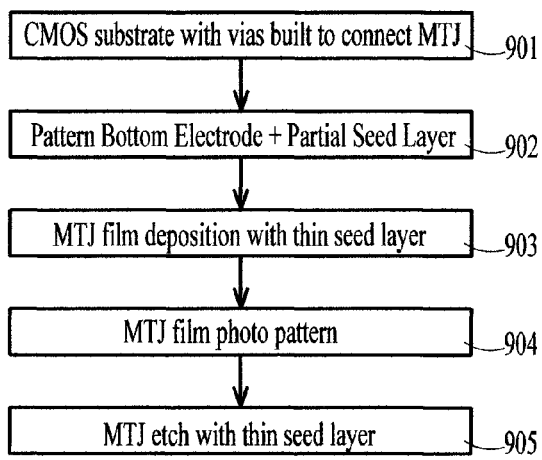
FIG. 9 is a flowchart of a second preferred embodiment of the present disclosure.
Figure 10:
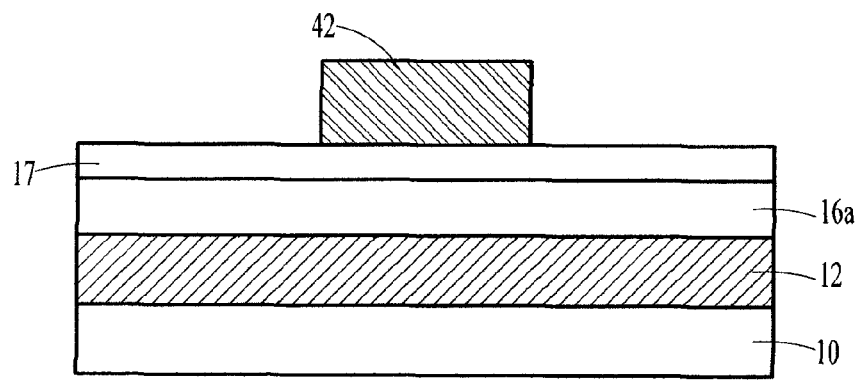
FIGS. 10 through 13 illustrate in cross-sectional representation steps in a second preferred embodiment of the present disclosure.

FIG. 9 is a flowchart of a second preferred embodiment process of the present disclosure. Refer also to FIGS. 10-13. In step 901, a CMOS substrate with vias is built to connect with the MTJ device to be formed subsequently. The substrate 10 is shown in FIG. 10. Next in step 902, a bottom electrode and partial seed layer are patterned. FIG. 10 illustrates bottom electrode layer 12, seed layer 16*a*, and a protective layer 17 such as Ta or TiN to be used as a hard mask for etching the seed layer. The bottom electrode and the seed layer can be patterned together using the seed layer as a hard mask for etching the bottom electrode or separately using two photolithography steps and subsequently planarized. Between about 60% and 80%, and preferably about 80% of the desired seed layer thickness could be deposited as layer 16*a*. 20% of the thickness will be deposited layer as layer 16*b*.

If a thin seed layer is deposited along with the MTJ film it may better act as a buffer layer for crystal growth continuity between the seed layer and the MTJ film. Depositing and patterning most of the seed layer now will provide the advantage of reducing plasma exposure time while also providing a thin buffer layer for crystal growth continuity when the MTJ layers are deposited.

Figure 11:
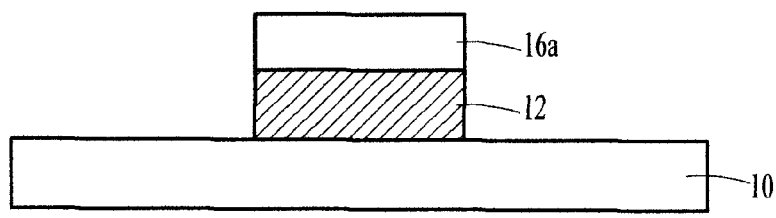
Figure 12:
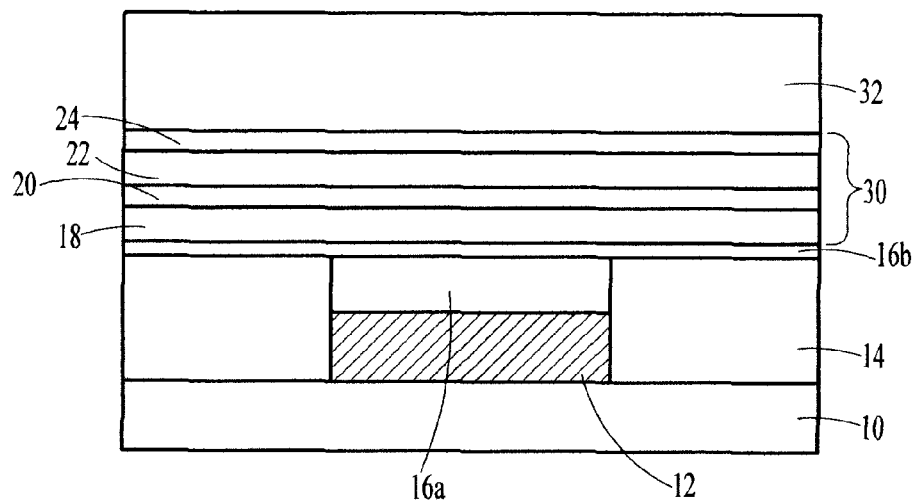

FIG. 11 shows the patterned bottom electrode 12 and seed layer 16*a*. Dielectric layer 14 is deposited and planarized, as shown in FIG. 12. Protective layer 17 is removed by chemical mechanical polishing (CMP) or another planarization process either before or after the dielectric layer 14 is formed. Protective layer 17 can also be removed during a sputter etch before MTJ film deposition. The seed layer 16*a* will be exposed, such as by the planarization step.

Now in step 903, the remainder of the seed layer 16*b*, about 20% of the desired seed layer thickness, is deposited directly contacting the first seed layer 16*a*, followed by the remaining MTJ film layers including pinned layer 18, barrier layer 20, free layer 22, and cap layer 24, as shown in FIG. 12. These layers form the MTJ film stack 30. Hard mask layer 32 is deposited on top of the MTJ layer stack.

Figure 13:
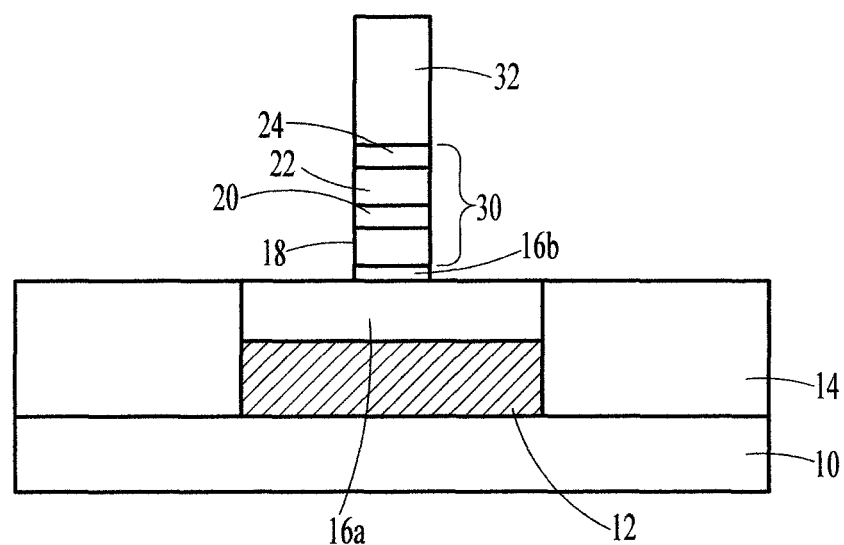

In step 904, a photoresist pattern is made to pattern the MTJ device and the pattern is transferred to the hard mask 32. In step 905, the MTJ stack is etched. FIG. 13 illustrates the etching of the MTJ stack. Since only a thin seed layer 16*b* is to be etched along with the rest of the MTJ film layers, the tunnel junction etching time is significantly reduced. Hence, there will be less etch damage and less re-deposition on the sidewall. As in the first embodiment, the pre-patterned seed layer 16*a* can be larger, equal to, or slightly smaller than the MTJ device.

In this second embodiment, the tunnel junction layers will grow on top of a continuous seed layer; however, etching time will be significantly reduced since the majority of the seed layer materials will be etched along with the bottom electrode prior to the MTJ etching. Therefore, there will be less etching damage and less re-deposition on the sidewall.

Depositing the seed layer along with the bottom electrode layer and patterning them together will reduce the MTJ device etching time and hence reduce etching damage and metal re-deposition along the MTJ sidewall. This should significantly improve the electrical short circuit issue and also improve device performance. The option to pattern the seed layer equal in width or narrower than the MTJ device further reduces metal re-deposition along sidewall. Optionally, instead of depositing all the seed layer along with the bottom electrode, the majority of the seed layer, about 80%, is deposited along with the bottom electrode layer and the seed layer and bottom electrode layer are patterned together. This way, only a thin layer of seed will be deposited along with the other MTJ film stack layers to reduce the MTJ device etching time and hence result in reduced etching damage and reduced metal re-deposition along the MTJ sidewall. The seed layer may be about ⅓ the thickness of the entire MTJ stack. Removing the etching of the seed layer to prior to depositing the MTJ layers can reduce MTJ stack etching time by as much as one-half.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method for etching a magnetic tunneling junction (MTJ) structure comprising:
providing a bottom electrode layer on a top surface of a substrate;
depositing a seed layer on said bottom electrode layer;
patterning said seed layer and said bottom electrode layer;

depositing a dielectric layer over patterned said seed layer and bottom electrode layer and planarizing said dielectric layer wherein said seed layer is exposed;

thereafter depositing a stack of MTJ layers comprising a pinned layer, a tunnel barrier layer, and a free layer wherein said stack of MTJ layers lies directly on only said patterned seed layer and said dielectric layer surrounding said patterned seed layer wherein said seed layer promotes growth of large crystal grains in overlying said stack of MTJ layers; and patterning said MTJ stack to form a MTJ device.

2. The method according to claim 1 wherein said seed layer is patterned to have a width equal to a width of said MTJ device.

3. The method according to claim 1 wherein said seed layer is patterned to have a width wider than a width of said MTJ device.

4. The method according to claim 1 wherein said seed layer is patterned to have a width narrower than a width of said MTJ device.

5. The method according to claim 1 wherein said seed layer is a first seed layer and further comprising:

depositing a second seed layer over patterned said first seed layer wherein a first thickness of said first seed layer is between about 60% and 80% of a second thickness of said first and second seed layers together; and patterning said second seed layer as part of said MTJ stack.

6. The method according to claim 1 wherein said seed layer and said bottom electrode layer are patterned separately.

7. The method according to claim 1 wherein said seed layer and said bottom electrode layer are patterned together.

8. A method for etching a magnetic tunneling junction (MTJ) structure comprising:

providing a bottom electrode layer on a substrate;
depositing a seed layer on said bottom electrode layer;
patterning said seed layer and said bottom electrode layer;
depositing a dielectric layer over patterned said seed layer and bottom electrode layer and planarizing said dielectric layer wherein said seed layer is exposed;

thereafter depositing a stack of MTJ layers comprising a pinned layer, a tunnel barrier layer, and a free layer wherein said stack of MTJ layers lies directly on only said patterned seed layer and said dielectric layer surrounding said patterned seed layer wherein said seed layer promotes growth of large crystal grains in overlying said stack of MTJ layers; and patterning said MTJ stack to form a MTJ device wherein said seed layer is patterned to have a width equal to or smaller than a width of said MTJ device.

9. The method according to claim 8 wherein said seed layer is a first seed layer and further comprising:

depositing a second seed layer over patterned said first seed layer wherein a first thickness of said first seed layer is between about 60% and 80% of a second thickness of said first and second seed layers together; and patterning said second seed layer as part of said MTJ stack.

10. The method according to claim 8 wherein said seed layer and said bottom electrode layer are patterned separately.

11. The method according to claim 8 wherein said seed layer and said bottom electrode layer are patterned together.

12. A method for etching a magnetic tunneling junction (MTJ) structure comprising:

providing a bottom electrode layer on a substrate;
depositing a first seed layer on said bottom electrode layer;
patterning said first seed layer and said bottom electrode layer;
depositing a dielectric layer over patterned said first seed layer and bottom electrode layer and planarizing said dielectric layer wherein said first seed layer is exposed;
thereafter depositing a stack of MTJ layers comprising a second seed layer, a pinned layer, a tunnel barrier layer, and a free layer wherein said second seed layer lies directly on only said patterned first seed layer and said dielectric layer surrounding said patterned first seed layer wherein said first and second seed layers together promote growth of large crystal grains in overlying said stack of MTJ layers; and
patterning said MTJ stack to form a MTJ device.

13. The method according to claim 12 wherein said first seed layer is patterned to have a width equal to a width of said MTJ device.

14. The method according to claim 12 wherein said first seed layer is patterned to have a width wider than a width of said MTJ device.

15. The method according to claim 12 wherein said first seed layer is patterned to have a width narrower than a width of said MTJ device.

16. The method according to claim 12 wherein a first thickness of said first seed layer is between about 60% and 80% of a second thickness of said first and second seed layers together.

17. The method according to claim 12 wherein said first seed layer and said bottom electrode layer are patterned separately.

18. The method according to claim 12 wherein said first seed layer and said bottom electrode layer are patterned together.

* * * * *